(12) United States Patent
Nito et al.

(10) Patent No.: US 8,299,849 B2
(45) Date of Patent: Oct. 30, 2012

(54) BINARIZATION CIRCUIT, DEMODULATION CIRCUIT, AND TUNER FOR VEHICLE

(75) Inventors: Yoshiharu Nito, Yokohama (JP); Tsuneo Suzuki, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/050,063

(22) Filed: Mar. 17, 2011

(65) Prior Publication Data

US 2012/0049949 A1 Mar. 1, 2012

(30) Foreign Application Priority Data

Aug. 26, 2010 (JP) ................................. 2010-189684

(51) Int. Cl.
*H03D 3/00* (2006.01)
(52) U.S. Cl. ........ 329/300; 329/301; 329/302; 329/303; 329/311; 329/347; 327/50; 327/72; 375/316; 375/320; 375/321
(58) Field of Classification Search .......... 329/300–303, 329/311, 347; 327/50, 72; 375/316, 320, 375/321, 334–337, 340–343
See application file for complete search history.

(56) References Cited

U.S. PATENT DOCUMENTS

| 5,420,545 | A | * | 5/1995 | Davis et al. ..................... 331/17 |
| 7,633,320 | B2 | | 12/2009 | Yamamoto et al. |

* cited by examiner

*Primary Examiner* — Arnold Kinkead
(74) *Attorney, Agent, or Firm* — Turocy & Watson, LLP (57) ABSTRACT

A binarization circuit includes a comparator that outputs a signal according to a differential voltage between the input and reference voltages. The first charging-discharging circuit generates a first voltage. The second charging-discharging circuit generates a second voltage. The control circuit compares the differential voltage with the threshold voltage, and switches between turn-on and turn-off of the second charging-discharging circuit based on a difference between the differential voltage and the threshold voltage. A sum of the reference and first voltages of the preceding clock is supplied to the comparator when the second charging-discharging circuit is turned off. A sum of the reference and the first and second voltages of the preceding clock is supplied to the comparator when the second charging-discharging circuit is turned on.

20 Claims, 9 Drawing Sheets

BINARIZATION CIRCUIT, DEMODULATION CIRCUIT, AND TUNER FOR VEHICLE

CROSS REFERENCE TO RELATED APPLICATIONS

This application is based upon and claims the benefit of priority from the prior Japanese Patent Application No. 2010-189684, filed on Aug. 26, 2010, the entire contents of which are incorporated herein by reference.

FIELD

Embodiments described herein relate generally to a binarization circuit, a demodulation circuit, and a tuner for a vehicle.

BACKGROUND

Conventionally, a demodulation circuit including a binarization circuit is provided in an in-vehicle system such as an RKE (Remote Keyless Entry) system. The binarization circuit is implemented by an analog circuit in which a comparator and a rapid charging-discharging circuit are combined. A capacitor that generates a reference voltage is connected to a reference terminal of the comparator. A resistor that fixes a threshold is connected to an external terminal of the rapid charging-discharging circuit.

Recently, it is demanded to shrink the binarization circuit. However, the shrinkage of the binarization circuit is limited because the binarization circuit is implemented by the analog circuit.

BRIEF DESCRIPTION OF THE DRAWINGS

FIG. 5B is a graph illustrating an output characteristic of the comparator 176 when the second charging-discharging circuit 173 of FIG. 4 is turned on.

DETAILED DESCRIPTION

Embodiments will now be explained with reference to the accompanying drawings.

In general, according to one embodiment, a binarization circuit includes a comparator, first and second charging-discharging circuits, and a control circuit. The comparator compares an input voltage with a reference voltage and outputs a signal in accordance with a differential voltage between the input voltage and the reference voltage. The first charging-discharging circuit generates a first voltage by multiplying the differential voltage by a first charge-discharge factor. The second charging-discharging circuit generates a second voltage by multiplying a difference between the differential voltage and a threshold voltage by a second charge-discharge factor greater than the first charge-discharge factor. The control circuit compares the differential voltage with the threshold voltage, and switches between turn-on and turn-off of the second charging-discharging circuit based on a difference between the differential voltage and the threshold voltage. A sum of the reference voltage of a preceding clock and the first voltage of the preceding clock is supplied to the comparator when the second charging-discharging circuit is turned off. A sum of the reference voltage of the preceding clock, the first voltage of the preceding clock, and the second voltage of the preceding clock is supplied to the comparator when the second charging-discharging circuit is turned on.

Figure 1:
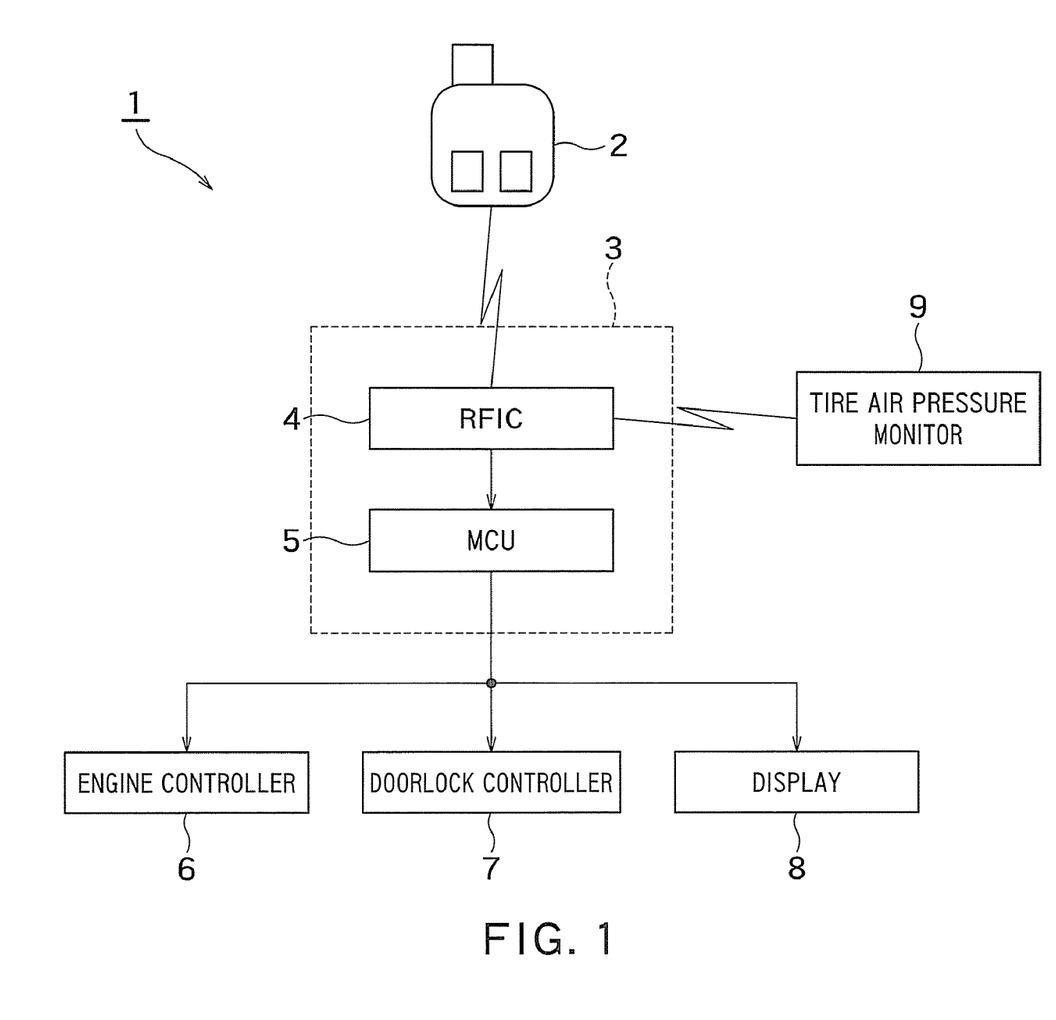
FIG. 1 is a block diagram illustrating a configuration of an in-vehicle system of one embodiment.

An in-vehicle system of one embodiment will now be explained. FIG. 1 is a block diagram illustrating a configuration of an in-vehicle system of one embodiment.

The in-vehicle system of FIG. 1 is an automobile control system. The in-vehicle system 1 includes a remote key 2, a receiving tuner 3, an engine controller 6, a doorlock controller 7, a display 8, and a tire air pressure monitor 9.

The remote key 2 of FIG. 1 transmits a modulated radio frequency signal (hereinafter referred to as an "RF signal"). For example, when a user presses a button of the remote key 2, the remote key 2 transmits the RF signal.

The tire air pressure monitor 9 of FIG. 1 monitors a tire air pressure of a tire (not illustrated) to transmits the RF signal indicating the monitoring result (that is, numerical value of the tire air pressure).

The receiving tuner 3 of FIG. 1 controls the engine controller 6, the doorlock controller 7, and the display 8 based on the RF signal transmitted from the remote key 2 or the tire air pressure monitor 9. The receiving tuner 3 includes a radio frequency integrated circuit (hereinafter referred to as "RFIC") 4 and a main control unit (hereinafter referred to as "MCU") 5.

The RFIC 4 of FIG. 1 generates binary data from the RF signal transmitted from the remote key 2 or the tire air pressure monitor 9. More specifically, the RFIC 4 switches between turn-on and turn-off at a constant period, receives the RF signal transmitted from the remote key 2 or the tire air pressure monitor 9 when being turned on, and generates the binary data by demodulating the received RF signal. For example, the binary data includes a header portion and a data portion. The detailed RFIC 4 is described later.

The MCU 5 of FIG. 1 is a microcomputer that controls the engine controller 6, the doorlock controller 7, and the display 8 based on the binary data generated by the RFIC 4. The MCU 5 authenticates the binary data generated by the RFIC 4. When the authentication succeeds, the MCU 5 generates control signals to control the engine controller 6, the doorlock controller 7, and the display 8, and transmits the generated control signals to the engine controller 6, the doorlock controller 7, and the display 8 according to a predetermined data transfer protocol. For example, the MCU 5 generates the control signal when previously-registered ID (Identification) information is matched with the binary data (that is, when the authentication succeeds), and the MCU 5 does not generate the control signal when the previously-registered ID information is not matched with the binary data (that is, the authentication fails). For example, the MCU 5 transmits the generated control signal to the engine controller 6, the doorlock controller 7, and the display 8 according to a CAN (Controller Area Network) protocol.

The engine controller 6 of FIG. 1 controls an engine. The engine controller 6 starts up the engine based on the control signal transmitted from the MCU 5.

The doorlock controller 7 of FIG. 1 controls lock and unlock of a door. The doorlock controller 7 locks and unlocks the door based on the control signal transmitted from the MCU 5.

The display 8 of FIG. 1 displays various pieces of information. The display 8 displays predetermined pieces of information (such as information indicating that the door is unlocked, information indicating that the engine is started up, and the numerical value of the tire air pressure) based on the control signal transmitted from the MCU 5.

Figure 2:
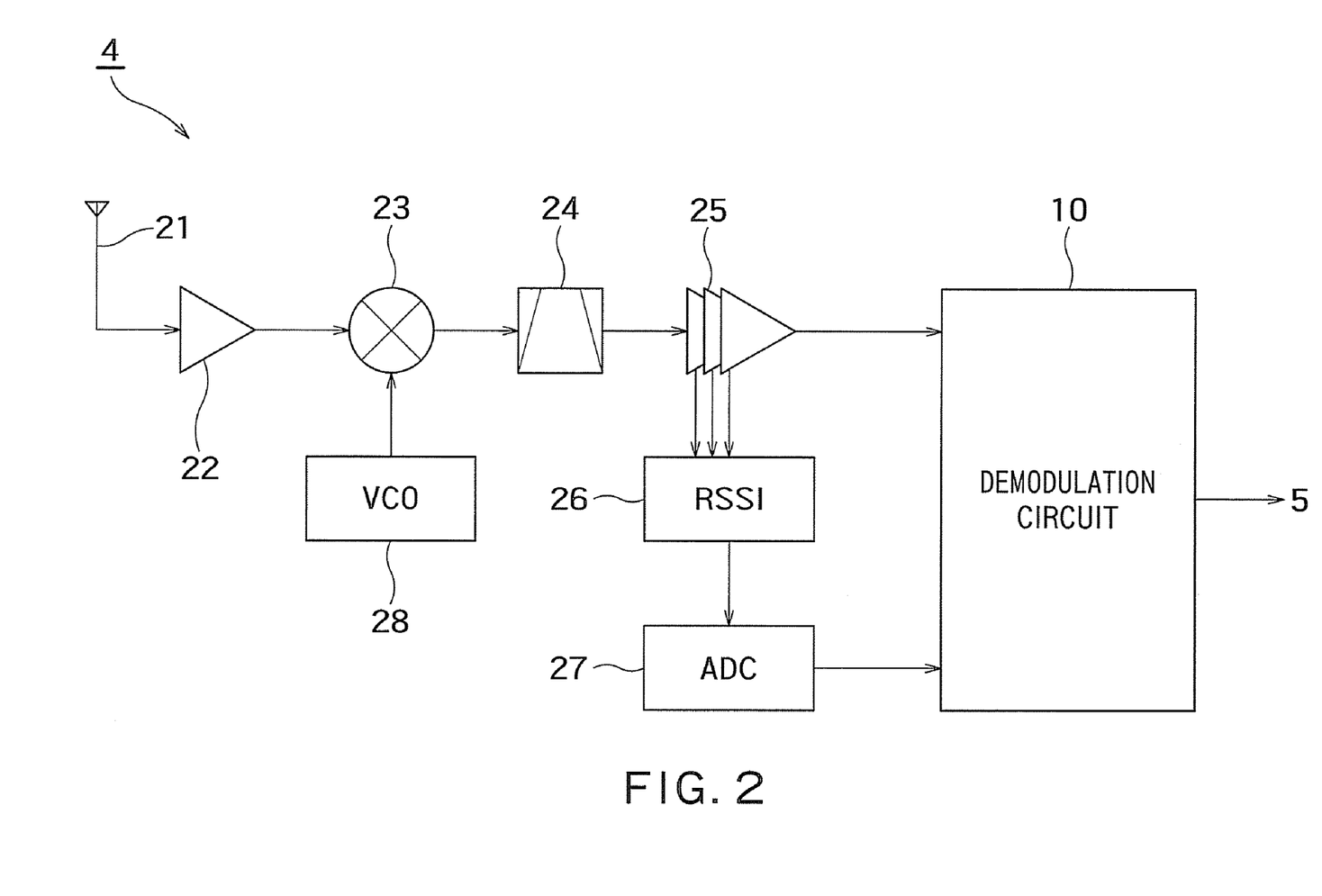
FIG. 2 is a block diagram illustrating a configuration of the RFIC 4 of FIG. 1.

The RFIC 4 of FIG. 1 will be explained below. FIG. 2 is a block diagram illustrating a configuration of the RFIC 4 of FIG. 1.

Referring to FIG. 2, the RFIC 4 includes an antenna 21, a low noise amplifier (hereinafter referred to as "LNA") 22, a mixer 23, a band pass filter (hereinafter referred to as "BPF") 24, a limiter amplifier 25, a received signal strength indicator (hereinafter referred to as "RSSI") 26, an analog digital converter (hereinafter referred to as "ADC") 27, a voltage controlled oscillator (hereinafter referred to as "VCO) 28, and a demodulation circuit 10. The RFIC 4 may be formed by either one chip or plural chips. A channel including the limiter amplifier 25 and the demodulation circuit 10 is used in frequency shift keying (hereinafter referred to as "FSK") modulation. A channel including the limiter amplifier 25, the RSSI 26, the ADC 27, and the demodulation circuit 10 is used in amplitude shift keying (hereinafter referred to as "ASK") modulation.

The antenna 21 of FIG. 2 receives the RF signal transmitted from the remote key 2 of FIG. 1. An output of the antenna 21 is the RF signal.

The LNA 22 of FIG. 2 amplifies the output (RF signal) of the antenna 21 with a low noise. An output of the LNA 22 is the amplified RF signal.

The mixer 23 of FIG. 2 performs down-conversion using an output of the VCO 28 to reduce an output frequency (frequency of amplified RF signal) of the LNA 22. More specifically, the mixer 23 subtracts an output frequency f(VCO_out) of the VCO 28 from an output frequency f(LNA_out) of the LNA 22. That is, an output frequency f(MIX_out) of the mixer 23 is expressed by "f(MIX_out)=|f(LNA_out)−f(VCO_out)|". The output of the mixer 23 is the RF signal (hereinafter referred to as "IF signal") in which the frequency is reduced.

The BPF 24 of FIG. 2 removes a noise component out of a passband from the output (IF signal) of the mixer 23. An output of the BPF 24 is the IF signal in which the noise component out of the passband is removed.

The limiter amplifier 25 of FIG. 2 clips an output waveform of the BPF 24 by amplifying the output (IF signal from which the noise component out of the passband is removed) of the BPF 24. An output of the limiter amplifier 25 is an FSK signal having a rectangular wave of 1 and 0.

The RSSI 26 of FIG. 2 generates an ASK demodulated signal having an amplitude corresponding to an output signal level (amplitude of FSK signal) of the limiter amplifier 25. More specifically, the RSSI 26 measures the output signal level of the limiter amplifier 25 and generates an ASK demodulated signal based on the measured output signal level. An output of the RSSI 26 is the ASK demodulated signal having the amplitude corresponding to an amplitude of an ASK modulated signal.

The ADC 27 of FIG. 2 converts the output (ASK demodulated signal) that is an analog signal of the RSSI 26 into a digital signal. An output of the ADC 27 is the digital ASK demodulated signal.

The demodulation circuit 10 of FIG. 2 generates binary data from the output (FSK signal) of the limiter amplifier 25 or the output (digital ASK demodulated signal) of the ADO 27.

As illustrated in FIG. 2, the RFIC 4 includes the RSSI 26 and the ADC 27. Therefore, the RFIC 4 can support both the FSK modulation and the ASK modulation.

Figure 3:
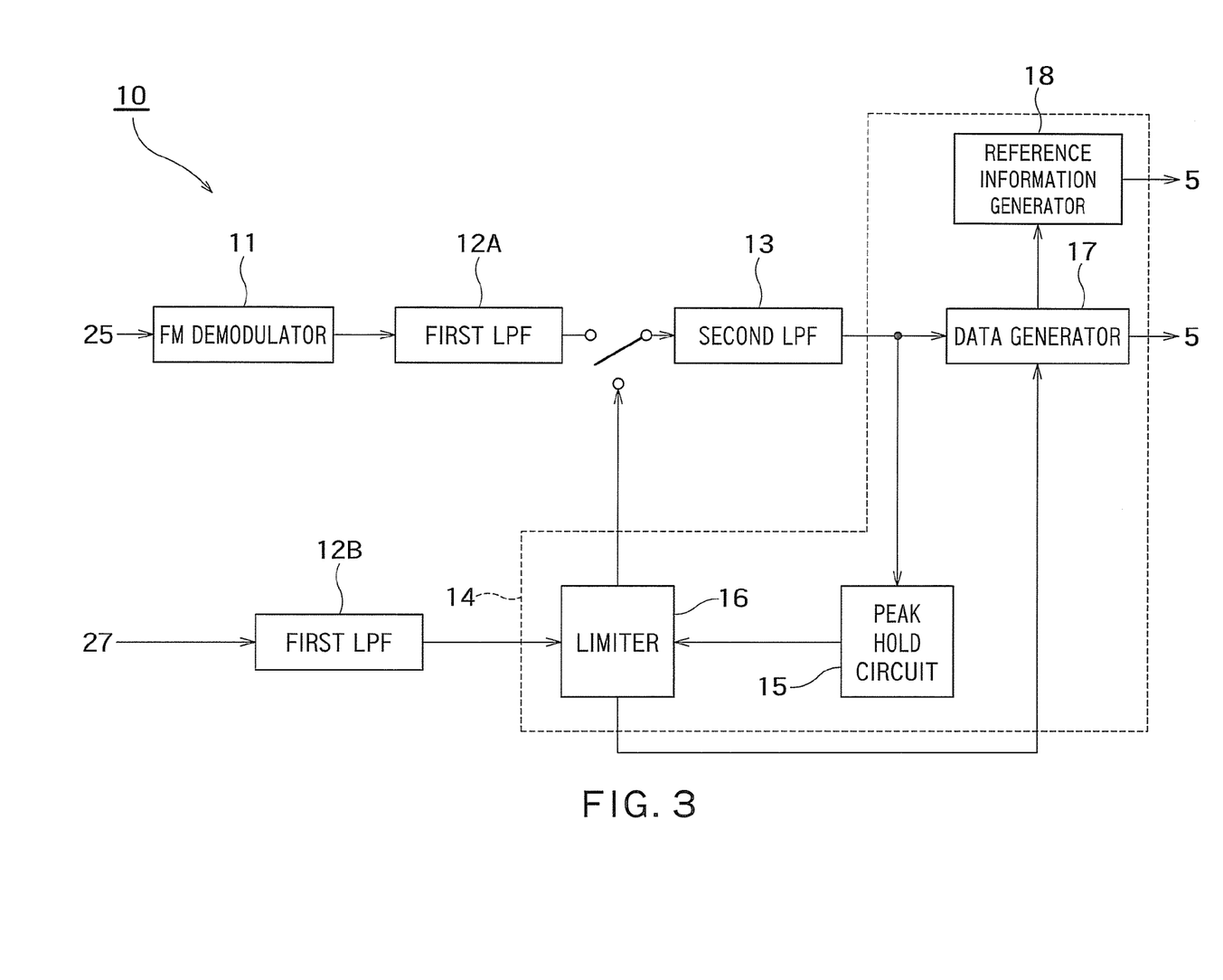
FIG. 3 is a block diagram illustrating a configuration of the demodulation circuit 10 of FIG. 2.

The demodulation circuit 10 of FIG. 2 will be explained below. FIG. 3 is a block diagram illustrating a configuration of the demodulation circuit 10 of FIG. 2.

Referring to FIG. 3, the demodulation circuit 10 includes a frequency modulation (hereinafter referred to as "FM") demodulator 11, first low pass filters (hereinafter referred to as "LPF") 12A and 12B, a second LPF 13, and a binarization circuit 14.

The FM demodulator 11 of FIG. 3 generates a digital FSK demodulated signal by applying frequency-voltage conversion to the output (FSK signal) of the limiter amplifier 25 of FIG. 2. An output of the FM demodulator 11 is the digital FSK demodulated signal.

The first LPF 12A of FIG. 3 is an LPF for FSK modulation. The first LPF 12A reduces a noise component of the output (digital FSK demodulated signal) of the FM demodulator 11 by limiting the frequency band of the output of the FM demodulator 11 to a predetermined first limitation band. An output of the first LPF 12A is the digital FSK demodulated signal in which the noise component is reduced.

The first LPF 12B of FIG. 3 is an LPF for ASK modulation. The first LPF 12B reduces a noise component of the output (digital ASK demodulated signal) of the ADC 27 by limiting the frequency band of the output of the ADC 27 of FIG. 2 to the first limitation band. An output of the first LPF 12B is the digital ASK demodulated signal in which the noise component is reduced.

The second LPF 13 of FIG. 3 further reduces the noise component of the output (the digital FSK demodulated signal in which the noise component is reduced) of the first LPF 12A or the output (the digital ASK demodulated signal in which the noise component is reduced) of the first LPF 12B by limiting the band of the output of the first LPF 12A or 12B to a second limitation band that changes according to a clock. The second LPF 13 is connected to the first LPF 12A in the FSK modulation, and is connected to a limiter 16 (described later) of the binarization circuit 14 in the ASK modulation. An output of the second LPF 13 is the digital FSK demodulated signal or digital ASK demodulated signal, in which the noise component is further reduced.

The binarization circuit 14 of FIG. 3 includes a peak hold circuit 15, the limiter 16, a data generator 17, and a reference information generator 18.

The data generator 17 of FIG. 3 generates binary data from the output (the FSK demodulated signal or digital ASK demodulated signal, in which the noise component is further reduced) of the second LPF 13.

Figure 4:
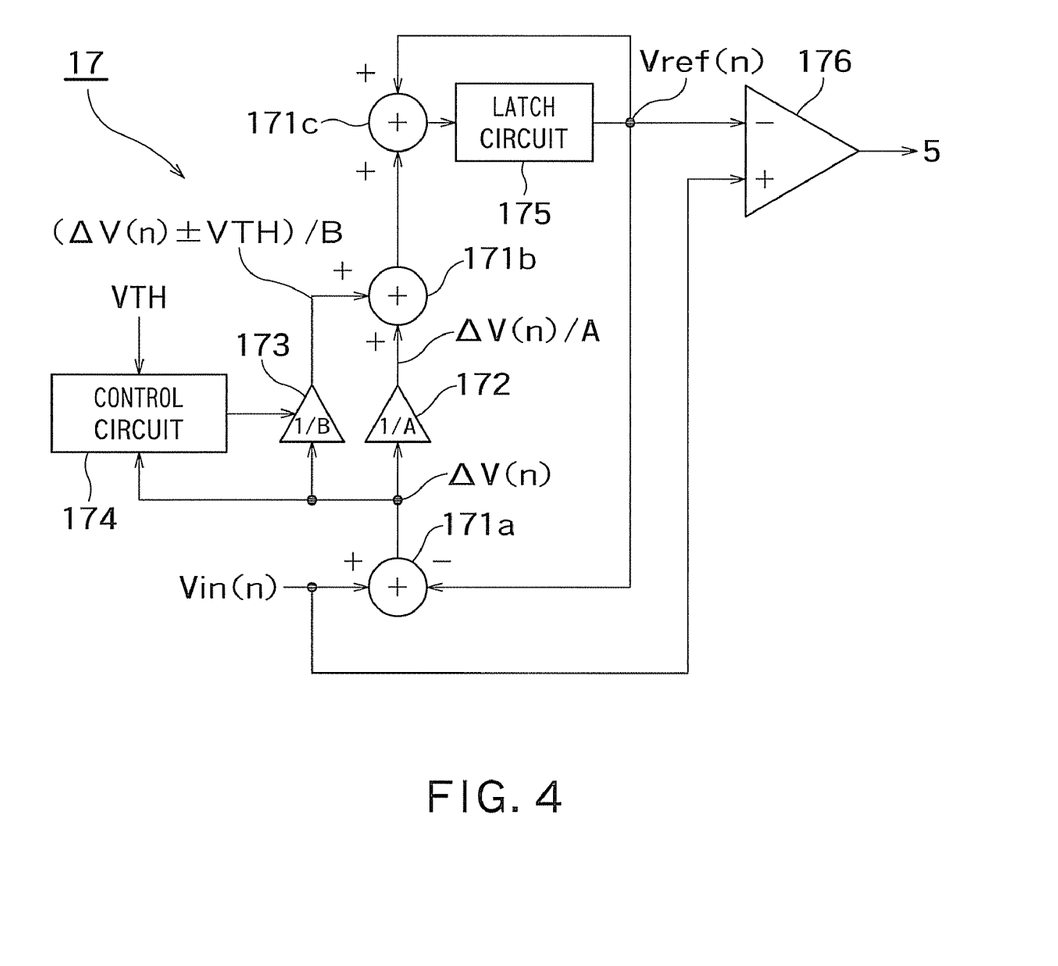
FIG. 4 is a block diagram illustrating a configuration of the data generator 17 of FIG. 3.
Figure 5A:
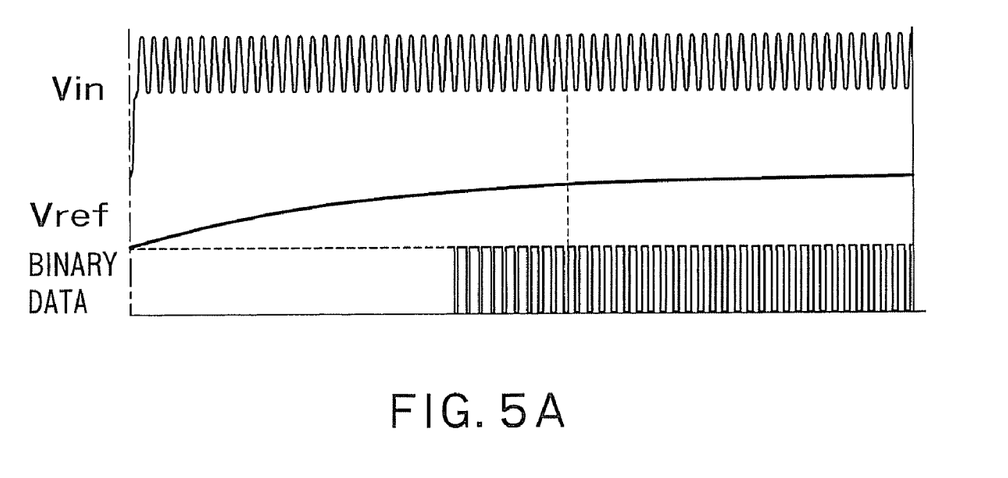
FIG. 5A is a graph illustrating an output characteristic of a comparator 176 of FIG. 4 when a second charging-discharging circuit 173 is turned off.

The data generator 17 of FIG. 3 will be explained below. FIG. 4 is a block diagram illustrating a configuration of the data generator 17 of FIG. 3. FIG. 5A is a graph illustrating an output characteristic of a comparator 176 of FIG. 4 when a second charging-discharging circuit 173 is turned off. FIG.

Figure 5B:
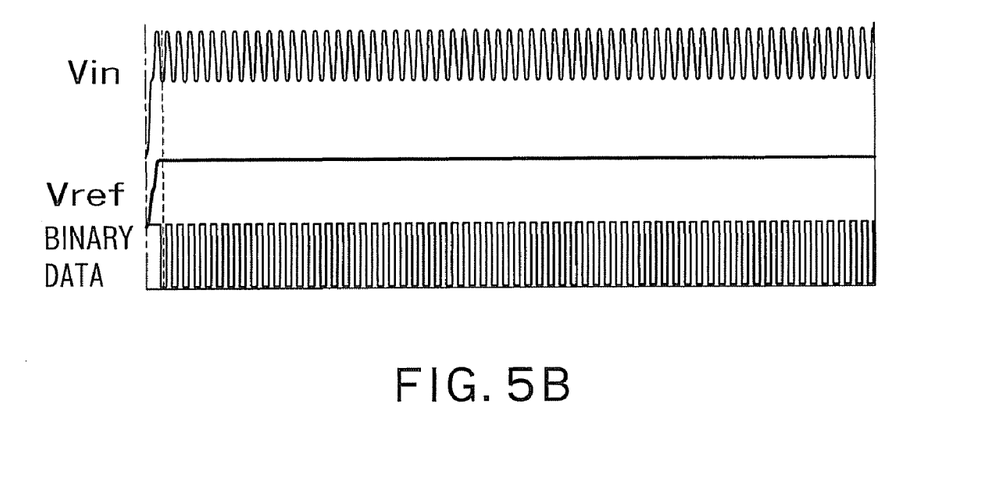

5B is a graph illustrating an output characteristic of the comparator 176 when the second charging-discharging circuit 173 of FIG. 4 is turned on.

Referring to FIG. 4, the data generator 17 includes a plurality of arithmetic units 171a to 171c, a first charging-discharging circuit 172, the second charging-discharging circuit 173, a control circuit 174, a latch circuit 175, and the comparator 176. An input voltage Vin(n) corresponding to an n-th clock CLK(n) is supplied to the data generator 17. The input voltage Vin(n) corresponds to the output (the digital FSK demodulated signal or digital ASK demodulated signal, in which the noise component is further reduced) of the second LPF 13 of FIG. 3.

The input voltage Vin(n) and an output (reference voltage Vref(n)) of the latch circuit 175 are supplied to the arithmetic unit 171a of FIG. 4. An output of the arithmetic unit 171a is a difference (hereinafter referred to as "differential voltage $\Delta V(n)$") between the input voltage Vin(n) and the reference voltage Vref(n).

The differential voltage $\Delta V(n)$ is supplied to the first charging-discharging circuit 172 of FIG. 4. The first charging-discharging circuit 172 generates a first voltage "$\Delta V(n)/A$" by multiplying the differential voltage $\Delta V(n)$ by a first charge-discharge factor 1/A. An output of the first charging-discharging circuit 172 is a first voltage "$\Delta V(n)/A$". A relationship among a time constant Tτ1 of the first charging-discharging circuit 172, a variable A (A>>1), and a clock period T is expressed by "Tτ1=T×A".

The differential voltage $\Delta V(n)$ is supplied to the second charging-discharging circuit 173 of FIG. 4. The second charging-discharging circuit 173 is a circuit that turned on when the differential voltage $\Delta V(n)$ is greater than a predetermined positive threshold voltage +VTH or lower than a predetermined negative threshold voltage −VTH (that is, an absolute value |$\Delta V(n)$| of the differential voltage is greater than an absolute value |VTH| of the threshold voltage). When the differential voltage $\Delta V(n)$ is greater than the positive threshold voltage +VTH, the second charging-discharging circuit 173 generates a second voltage "($\Delta V(n)$−VTH)/B" by multiplying a difference between the differential voltage $\Delta V(n)$ and the positive threshold voltage +VTH by a second charge-discharge factor "1/B" that is greater than the first charge-discharge factor "1/A". When the differential voltage $\Delta V(n)$ is lower than the negative threshold voltage −VTH, the second charging-discharging circuit 173 generates a second voltage "($\Delta V(n)$+VTH)/B" by multiplying a difference between the differential voltage $\Delta V(n)$ and the negative threshold voltage −VTH by the second charge-discharge factor "1/B". An output of the second charging-discharging circuit 173 is a "$\Delta V(n)$−VTH)/B" or "($\Delta V(n)$+VTH)/B". A relationship among a time constant Tτ2 of the second charging-discharging circuit 173, a variable B (A>>B>1), and a clock period T is expressed by "Tτ2=T×B".

The differential voltage $\Delta V(n)$ and the threshold voltage VTH (the threshold voltage (hereinafter referred to as "FSK threshold voltage VTH(FSK)") in the FSK modulation and the threshold voltage (hereinafter referred to as "ASK threshold voltage VTH(ASK)") in the ASK modulation) are supplied to the control circuit 174 of FIG. 4. The control circuit 174 compares the differential voltage $\Delta V(n)$ with the threshold voltage VTH and switches between the turn-on and turn-off of the second charging-discharging circuit 173 based on a difference between the differential voltage $\Delta V(n)$ and the threshold voltage VTH. More specifically, the control circuit 174 turns on the second charging-discharging circuit 173 when the absolute value |$\Delta V(n)$| of the differential voltage is greater than the absolute value |VTH| of the threshold voltage, and the control circuit 174 turns off the second charging-discharging circuit 173 when the absolute value |$\Delta V(n)$| of the differential voltage is lower than the absolute value |VTH| of the threshold voltage. Therefore, the data generator 17 can be operated at high speed.

Preferably, at least one of the first charge-discharge factor "1/A" and the second charge-discharge factor "1/B" is expressed by $2^{-m}$ (m is a natural number). Therefore, the data generator 17 of FIG. 4 can further be shrunk.

Preferably, at least one of the first charge-discharge factor "1/A" and the second charge-discharge factor "1/B" is expressed by $2^{-m}+2^{-(m-1)}$. Therefore, the data generator 17 of FIG. 4 can further be shrunk.

Preferably, only when an electric power is supplied to the RFIC 4 of FIG. 1 (that is, only when the receiving tuner 3 is powered on), the control circuit 174 of FIG. 4 turns on the second charging-discharging circuit 173, and keeps the second charging-discharging circuit 173 in the on-state until the output of the data generator 17 transits from low to high or from high to low (that is, the output level of the data generator 17 changes). In other words, only when the electric power is supplied to the RFIC 4 of FIG. 4 (that is, only when the receiving tuner 3 is powered on), the control circuit 174 turns on the second charging-discharging circuit 173, and keeps the second charging-discharging circuit 173 in the on-state until the output level of the binarization circuit 14 changes. Therefore, the time constant Tτ2 of the second charging-discharging circuit 173 is invalidated in a stepwise manner (that is, a time constant of the whole data generator 17 is gently delayed). Even if the threshold voltage VTH is not supplied, the second charging-discharging circuit 173 can be switched between the turn-on and the turn-off. As a result, versatility of the binarization circuit 14 can be improved.

Figure 8:
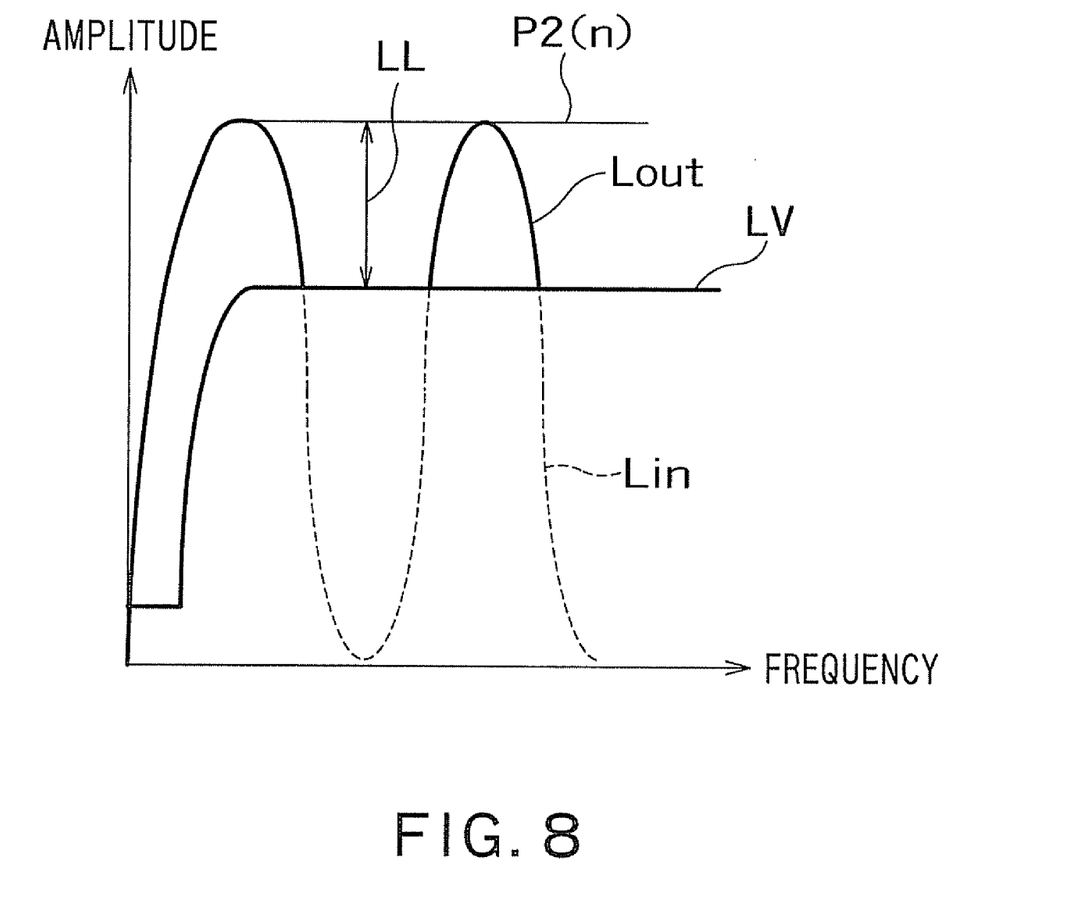
FIG. 8 is a graph illustrating an output characteristic of the output selector 163 of FIG. 6.

Preferably, the positive threshold voltage +VTH differs from the absolute value |−VTH| of the negative threshold voltage. For example, the positive threshold voltage +VTH may be 15 while the absolute value |−VTH| of the negative threshold voltage is 10. During the ASK demodulation, as illustrated in FIG. 8, a lower side of an output waveform of the limiter 16 of FIG. 3 is widened because the amplitude of the lower side is limited, and duty of the binarized signal that is the output of the data generator 17 of FIG. 3 is deviated. However, the positive threshold voltage +VTH is set greater than the absolute value |−VTH| of the negative threshold voltage, thereby correcting the duty of the binarized signal.

When the second charging-discharging circuit 173 is turned on, the first voltage "($\Delta V(n)$)/A" and the second voltage "(AV(n)−VTH)/B" or "($\Delta V(n)$+VTH)/B" are supplied to the arithmetic unit 171b of FIG. 4. When the second charging-discharging circuit 173 is turned off, the first voltage "$\Delta V(n)/A$" is supplied to the arithmetic unit 171b without the second voltage "(AV(n)−VTH)/B" or "($\Delta V(n)$+VTH)/B". An output of the arithmetic unit 171b is "$\Delta V(n)(1/A+1/B)$−VTH/B" or "$\Delta V(n)(1/A+1/B)$+VTH/B" when the second charging-discharging circuit 173 is turned on, and the output of the arithmetic unit 171b is "$\Delta V(n)/A$" when the second charging-discharging circuit 173 is turned off.

When the second charging-discharging circuit 173 is turned on, the output "$\Delta V(n)(1/A+1/B)$−VTH/B" or "$\Delta V(n)(1/A+1/B)$+VTH/B" of the charging-discharging circuit 171b and the output (reference voltage Vref(n)) of the latch circuit 175 are supplied to the charging-discharging circuit 171c of FIG. 4. When the second charging-discharging circuit 173 is turned off, "$\Delta V(n)/A$" and the output (reference voltage Vref(n)) of the latch circuit 175 is supplied to the charging-discharging circuit 171c. An output of the charging-discharging circuit 171c is "Vref(n)+$\Delta V(n)(1/A+1/B)$−VTH/B" or "Vref (n)+ΔV(n)(1/A+1/B)+VTH/B" when the second charging-discharging circuit 173 is turned on, and the output of the charging-discharging circuit 171c is "Vref(n)+ΔV(n)/A" when the second charging-discharging circuit 173 is turned off.

The output "Vref(n)+ΔV(n)(1/A+1/B)−VTH/B", "Vref(n)+ΔV(n)(1/A+1/B)+VTH/B", or "Vref(n)+ΔV(n)/A" of the arithmetic unit 171c is supplied to the latch circuit 175 of FIG. 4. The latch circuit 175 latches the output of the arithmetic unit 171c for only one clock. An output of the latch circuit 175 is the reference voltage Vref(n). That is, the reference voltage Vref(n) depends on the output (reference voltage Vref(n−1)) of the arithmetic unit 171c, which is latched by the preceding clock. The output (reference voltage Vref(n)) of the latch circuit 175 is expressed by an equation 1 when the second charging-discharging circuit 173 is turned off, and the output is expressed by an equation 2 or 3 when the second charging-discharging circuit 173 is turned on. The equation 2 expresses the output of the latch circuit 175 when the differential voltage ΔV(n) is greater than the positive threshold voltage +VTM. The equation 3 expresses the output of the latch circuit 175 when the differential voltage ΔV(n) is lower than the negative threshold voltage −VTH.

$$Vref(n) = Vref(n-1) + \frac{\Delta V(n)}{A} \quad \text{(equation 1)}$$

$$Vref(n) = Vref(n-1) + \frac{\Delta V(n)}{A} + \frac{\Delta V(n) - VTH}{B} \quad \text{(equation 2)}$$

$$Vref(n) = Vref(n-1) + \frac{\Delta V(n)}{A} + \frac{\Delta V(n) + VTH}{B} \quad \text{(equation 3)}$$

The output (reference voltage Vref(n)) of the latch circuit 175 and the input voltage Vin(n) are supplied to the comparator 176 of FIG. 4. The comparator 176 compares the input voltage Vin(n) with the reference voltage Vref(n) to output a signal in accordance with the differential voltage ΔV(n). An output of the comparator 176 is binary data corresponding to the differential voltage ΔV(n). For example, the comparator 176 outputs "1" indicating high when the input voltage Vin(n) is equal to or greater than the reference voltage Vref(n), and outputs "0" indicating low when the input voltage Vin(n) is lower than the reference voltage Vref(n). The comparator 176 may invert the signal in accordance with the differential voltage ΔV(n) to output the signal. In such cases, the comparator 176 outputs "0" when the input voltage Vin(n) is equal to or greater than the reference voltage Vref(n), and outputs "1" when the input voltage Vin(n) is lower than the reference voltage Vref(n).

When the second charging-discharging circuit 173 of FIG. 4 is turned off, the sum of the reference voltage Vref(n−1) and the first voltage "ΔV(n−1)/A" of the preceding clock are supplied to the comparator 176 as the new reference voltage Vref(n), thereby obtaining the characteristic (A=1024) illustrated in FIG. 5A. FIG. 5A shows that the reference voltage Vref gently reaches an average value of the input voltage Vin and the binary data is obtained since the reference voltage Vref reaches the average value of the input voltage Vin.

On the other hand, when the second charging-discharging circuit 173 of FIG. 4 is turned on, the sum of the reference voltage Vref(n−1) of the preceding clock, the first voltage "ΔV(n−1)/A" of the preceding clock, and the second voltage "(ΔV(n)−VTH)/B" or "(ΔV(n)+VTH)/B" is supplied to the comparator 176 as the new reference voltage Vref(n), thereby obtaining the characteristic (A=1024 and B=4) illustrated in FIG. 5B. FIG. 5B shows that the reference voltage Vref rapidly reaches the average value of the input voltage Vin and the binary data is obtained in timing earlier than that of FIG. 5A.

The peak hold circuit 15 of FIG. 3 holds a peak value of the output (the digital ASK demodulated signal in which the noise component is further reduced) of the second LPF 13. The peak hold circuit 15 is turned on when the ΔV(n) is equal to or more than 0. Preferably, the peak hold circuit 15 is implemented by the same circuit as the data generator 17 of FIG. 4 except that the threshold voltage VTH is 0. Therefore, the peak hold circuit 15 can be shrunk. An output of the peak hold circuit 15 is the peak value of the digital ASK demodulated signal.

The limiter 16 of FIG. 3 limits the output signal level (the amplitude of the digital ASK demodulated signal in which the noise component is reduced) of the first LPF 12B based on the output (the peak value of the digital ASK demodulated signal) of the peak hold circuit 15 and supplies an ASK threshold voltage VTH(ASK) to the data generator 17. An output of the limiter 16 is the digital ASK demodulated signal and the ASK threshold voltage VTH (ASK), in which the amplitudes are limited.

Figure 6:
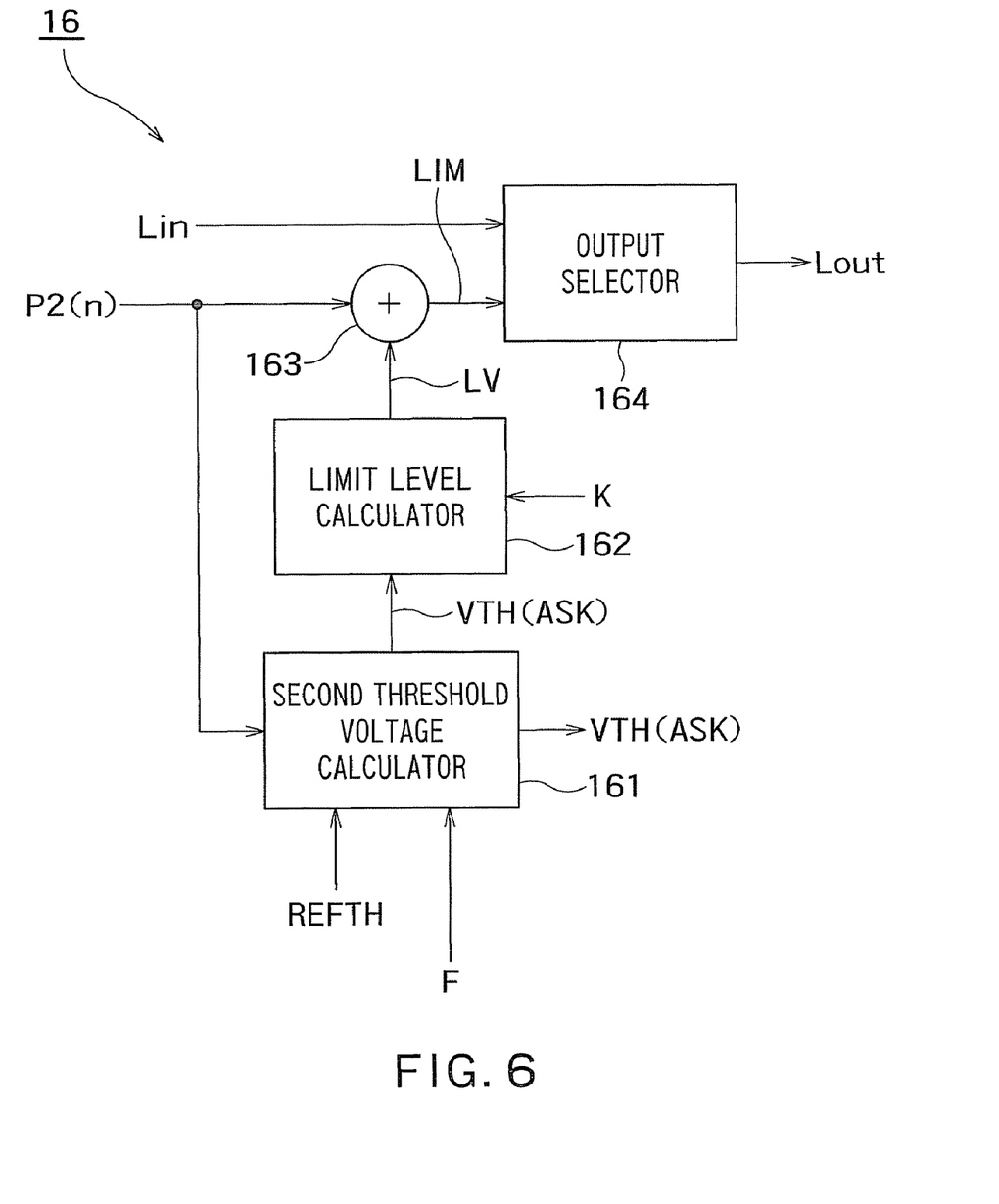
FIG. 6 is a block diagram illustrating a configuration of the limiter 16 of FIG. 3.
Figure 7A:
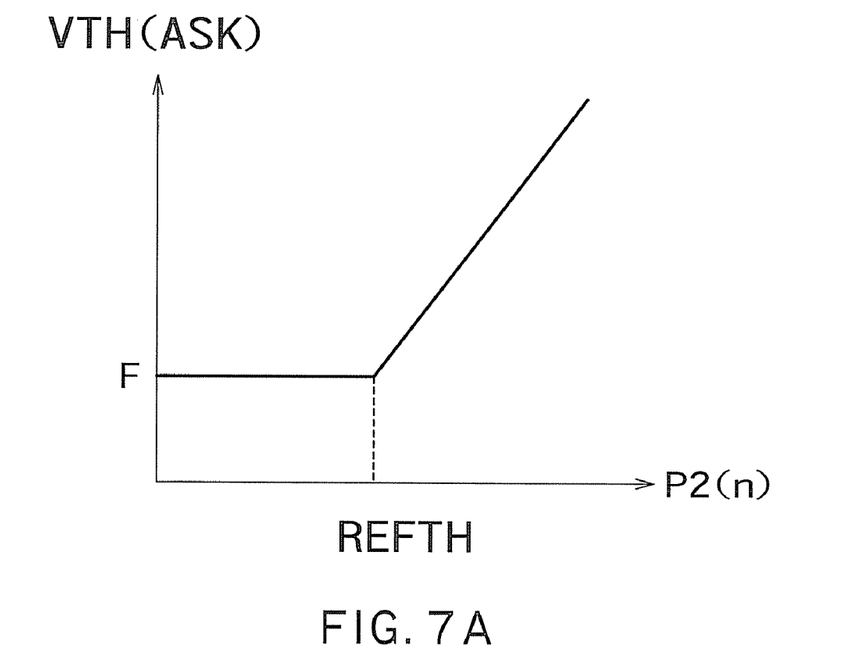
FIG. 7A is a graph illustrating an output characteristic of a second threshold voltage calculator 161 of FIG. 5.
Figure 7B:
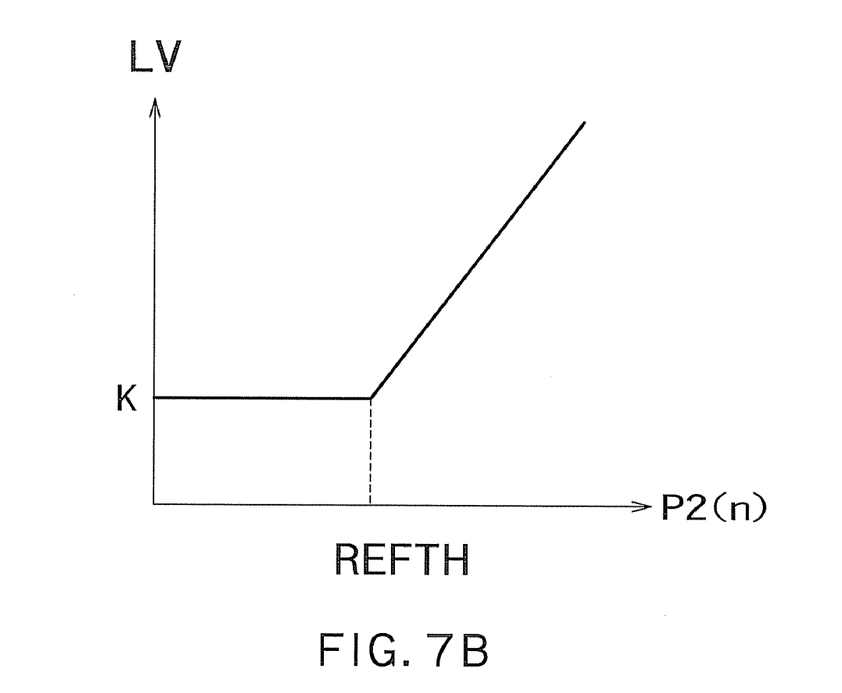
FIG. 7B is a graph illustrating an output characteristic of a limit level calculator 162 of FIG. 5.

The limiter 16 of FIG. 3 will be explained below. FIG. 6 is a block diagram illustrating a configuration of the limiter 16 of FIG. 3. FIG. 7A is a graph illustrating an output characteristic of a second threshold voltage calculator 161 of FIG. 5. FIG. 7B is a graph illustrating an output characteristic of a limit level calculator 162 of FIG. 5. FIG. 8 is a graph illustrating an output characteristic of the output selector 163 of FIG. 6.

Referring to FIG. 6, the limiter 16 includes a second threshold voltage calculator 161, a limit level calculator 162, an arithmetic unit 163, and an output selector 164.

The second threshold voltage calculator 161 of FIG. 6 calculates the ASK threshold voltage VTH(ASK). An output (peak value P2($n$)) of the peak hold circuit 15 of FIG. 3, a predetermined fixed value F, and a predetermined reference threshold REFTH are supplied to the second threshold voltage calculator 161. As illustrated in FIG. 7A, the output (ASK threshold voltage VTH(ASK)) of the second threshold voltage calculator 163 is a fixed value F when the peak value P2($n$) is lower than the reference threshold REFTH, and the output is a value proportional to the peak value P2 when the peak value P2($n$) is more than the reference threshold REFTH.

The limit level calculator 162 of FIG. 6 calculates a limit level LV. The output (ASK threshold voltage VTH(ASK)) of the second threshold voltage calculator 161 and a predetermined fixed value K are supplied to the limit level calculator 162. The limit level calculator 162 calculates the limit level LV based on the ASK threshold voltage VTH(ASK). As illustrated in FIG. 7B, an output of the limit level calculator 162 is the fixed value K when the peak value P2($n$) is lower than the reference threshold REFTH, and the output is a value proportional to the peak value P2 when the peak value P2($n$) is more than the reference threshold REFTH.

The arithmetic unit 163 of FIG. 6 calculates a limit value LIM. The output (peak value P2($n$)) of the peak hold circuit 15 of FIG. 3 and the output (limit level LV) of the limit level calculator 162 are supplied to the arithmetic unit 163. An output of the arithmetic unit 163 is the limit value LIM. The limit value LIM is expressed by "P2($n$)−LV".

In FIG. 6, the output of the second threshold voltage calculator 161 is supplied to the limit level calculator 162 by way of example. However, the scope of the invention is not limited to the example of FIG. 6. The invention can also be applied to the case in which the output (limit level LV) of the limit level calculator 162 is supplied to the second threshold voltage calculator 161 that calculates the ASK threshold voltage VTH (ASK) based on the output of the limit level calculator 162.

The output selector 164 of FIG. 6 selects the output of the limiter 16. The output (digital ASK demodulated signal Lin) of the first LPF 12B of FIG. 3 and the output (limit value LIM) of the arithmetic unit 163 are supplied to the output selector 164. The output selector 164 selects a digital ASK demodulated signal Lin as an output signal. Lout when the digital ASK demodulated signal Lin is more than the limit value LIM. The output selector 164 selects a digital ASK demodulated signal "Lin-LIM" in which the amplitude is limited as the output signal Lout when the digital ASK demodulated signal Lin is equal to or lower than the limit value LIM.

Therefore, as illustrated in FIG. 8, the amplitude of the output (the digital ASK demodulated signal Lout in which the noise component is further reduced) of the second LPF 13 can be limited between the peak value P2($n$) and the limit level LV. Bit information (0,1) on the digital ASK demodulated signal Lout in which the amplitude is limited corresponds to a binary amplitude (high level or low level) of a carrier. Therefore, even if the low level is in a non-signal state, the noise component generated in the non-signal state can be reduced.

Figure 9:
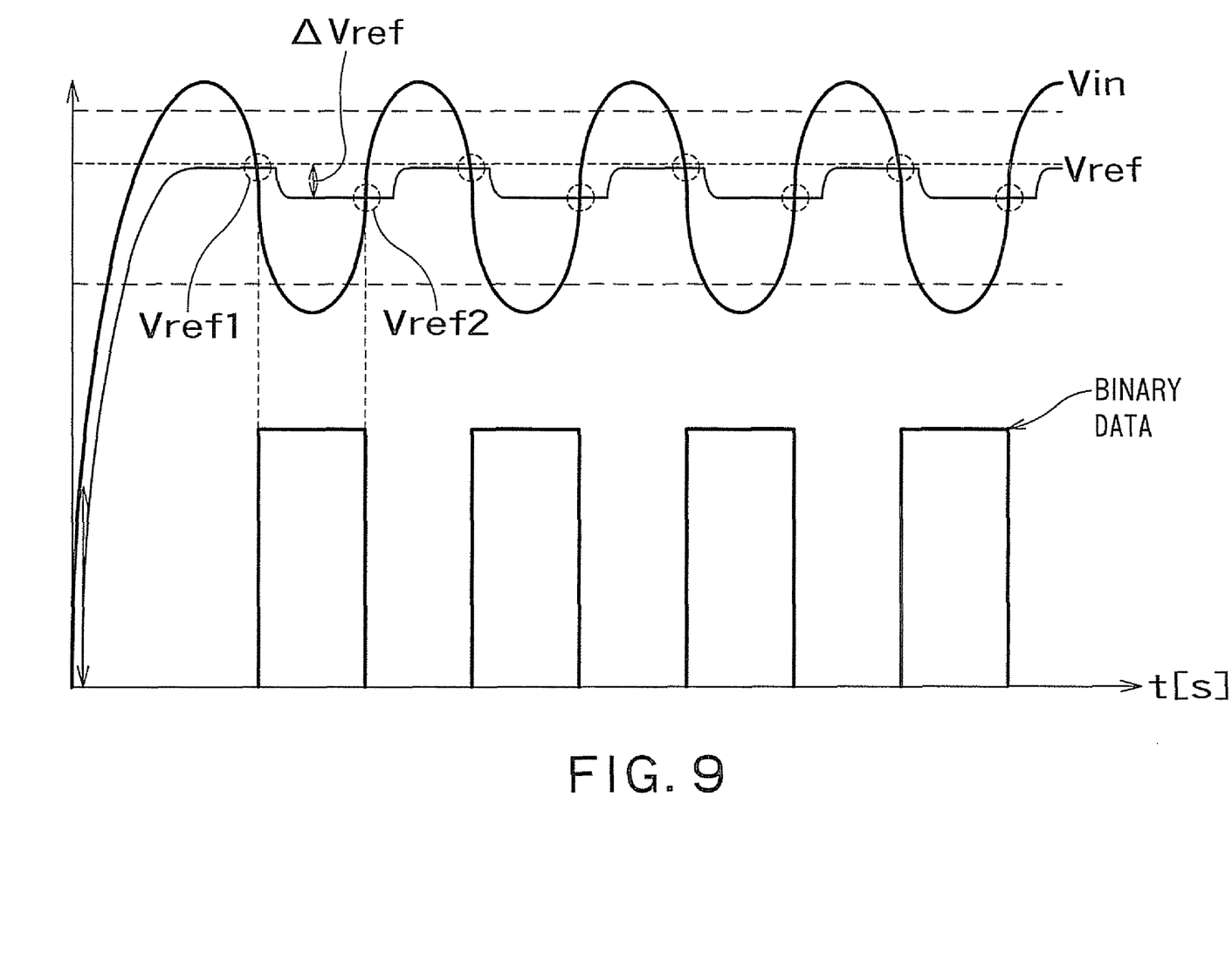
FIG. 9 is a graph illustrating explanation of calculating FSK threshold voltage VTH(FSK) by the MCU 5 of FIG. 1.

The reference information generator 18 of FIG. 3 generates reference information to calculate the FSK threshold voltage VTH(FSK) based on the output (binary data) of the data generator 17 and supplies the generated reference information to the MCU 5 of FIG. 1. Then, the MCU 5 calculates the FSK threshold voltage VTH(FSK) based on the output (reference information) of the reference information generator 18 and supplies the calculated FSK threshold voltage VTH (FSK) to the data generator 17. More specifically, the reference information generator 18 calculates a difference ΔVref between a reference voltage Vref1 corresponding to a rising edge of the output (binary data) of the comparator 176 of FIG. 4 and a reference voltage Vref2 corresponding to a falling edge (see FIG. 9) of the output (binary data), and supplies the calculated difference ΔVref as the reference information to the MCU 5. Then, the MCU 5 calculates the FSK threshold voltage VTH(FSK) such that the difference ΔVref comes close to 0, and feeds back the calculated FSK threshold voltage VTH(FSK) to the data generator 17. The MCU 5 repeats the processing until the desired FSK threshold voltage VTH (FSK) is obtained. Therefore, a processing amount necessary for the MCU 5 to obtain the desired FSK threshold voltage VTH (FSK) can be reduced. When the comparator 176 inverts the signal in accordance with the differential voltage ΔV(n), the output (binary data) of the comparator 176 is inverted and the position of the reference voltage Vref1 corresponding to the rising edge and the position of the reference voltage Vref2 corresponding to the falling edge are replaced with each other in FIG. 9.

According to the embodiment, as illustrated in FIG. 4, the data generator 17 is implemented by a digital circuit. That is, the data generator 17 is implemented without a capacitor. As a result, it is not necessary to provide a switch that switches the capacitor. Therefore, compared with the conventional binarization circuit, the data generator 17 is shrunk. Because the data generator 17 is implemented by the digital circuit, the characteristic of the data generator 17 is not influenced by a temperature or a variation of the element.

According to the embodiment, as illustrated in FIG. 3, the data generator 17 includes the peak hold circuit 15 and the limiter 16. Therefore, the data generator 17 can support both the FSK modulation and the ASK modulation.

In the embodiment, an oversampling circuit may be provided between a terminal of the comparator 176, at which the input voltage Vin(n) is supplied, and a terminal of the data generator 16, at which the input voltage Vin(n) is supplied. The oversampling circuit interpolates a waveform of the input voltage Vin(n) (that is, applies the oversampling to the waveform of input voltage Vin(n)) such that a temporal axis resolution of the input voltage Vin supplied to the comparator 176 becomes finer. More specifically, the oversampling circuit up-converts the waveform of the input voltage Vin(n) using a faster clock such that a temporal axis step width of the input voltage Vin(n) supplied to the comparator 176 becomes finer, and interpolates the up-converted sampling value using an average value of the preceding and subsequent sampling values of the up-converted sampling value. That is, the oversampling circuit enhances the temporal axis resolution of the input voltage Vin(n) supplied to the comparator 176 without changing the voltages (input voltage Vin(n) and reference voltage Vref(n)) supplied to the data generator 17. Therefore, a jitter of the data generator 17 can be reduced, and the increase in power consumption of the data generator 17 can be suppressed.

In the embodiment, the clock speed of the comparator 176 of FIG. 4, the first charging-discharging circuit 172, and the second charging-discharging circuit 173 may be equal to that of the second LPF 13 of FIG. 3. Therefore, cutoff frequencies of the first LPFs 12A and 12B and second LPF 13, the time constant Tτ1 of the first charging-discharging circuit 172, and the time constant Tτ2 of the second charging-discharging circuit 173 can simultaneously be adjusted.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. A binarization circuit comprising:
a comparator configured to compare an input voltage with a reference voltage and output a signal in accordance with a differential voltage between the input voltage and the reference voltage;
a first charging-discharging circuit configured to generate a first voltage by multiplying the differential voltage by a first charge-discharge factor;
a second charging-discharging circuit configured to generate a second voltage by multiplying a difference between the differential voltage and a threshold voltage by a second charge-discharge factor greater than the first charge-discharge factor; and
a control circuit configured to compare the differential voltage with the threshold voltage, and switch between turn-on and turn-off of the second charging-discharging circuit based on a difference between the differential voltage and the threshold voltage,
wherein a sum of the reference voltage of a preceding clock and the first voltage of the preceding clock is supplied to the comparator when the second charging-discharging circuit is turned off, a sum of the reference voltage of the preceding clock, the first voltage of the preceding clock, and the second voltage of the preceding clock is supplied to the comparator when the second charging-discharging circuit is turned on.

2. The circuit of claim 1, wherein the control circuit turns on the second charging-discharging circuit when an absolute value of the differential voltage is greater than an absolute value of the threshold voltage.

3. The circuit of claim 1, wherein at least one of the first charge-discharge factor and the second charge-discharge factor is expressed by $2^{-m}$ (m is a natural number).

4. The circuit of claim 2, wherein at least one of the first charge-discharge factor and the second charge-discharge factor is expressed by $2^{-m}$ (m is a natural number).

5. The circuit of claim 1, wherein at least one of the first charge-discharge factor and the second charge-discharge factor is expressed by $2^{-m}+2^{-(m-1)}$ (m is a natural number).

6. The circuit of claim 2, wherein at least one of the first charge-discharge factor and the second charge-discharge factor is expressed by $2^{-m}+2^{-(m-1)}$ (m is a natural number).

7. The circuit of claim 1, wherein the control circuit turns on the second charging-discharging circuit, and keeps the second charging-discharging circuit in the on-state until the output level of the binarization circuit changes.

8. The circuit of claim 2, wherein the control circuit turns on the second charging-discharging circuit, and keeps the second charging-discharging circuit in the on-state until the output level of the binarization circuit changes.

9. The circuit of claim 3, wherein the control circuit turns on the second charging-discharging circuit, and keeps the second charging-discharging circuit in the on-state until the output level of the binarization circuit changes.

10. The circuit of claim 4, wherein the control circuit turns on the second charging-discharging circuit, and keeps the second charging-discharging circuit in the on-state until the output level of the binarization circuit changes.

11. The circuit of claim 1, further comprising an oversampling circuit configured to apply an oversampling to a waveform of the input voltage in such a manner that a temporal axis resolution of the input voltage supplied to the comparator becomes finer.

12. The circuit of claim 2, further comprising an oversampling circuit configured to apply an oversampling to a waveform of the input voltage in such a manner that a temporal axis resolution of the input voltage supplied to the comparator becomes finer.

13. The circuit of claim 3, further comprising an oversampling circuit configured to apply an oversampling to a waveform of the input voltage in such a manner that a temporal axis resolution of the input voltage supplied to the comparator becomes finer.

14. The circuit of claim 1, further comprising a peak hold circuit configured to hold a peak value of the input voltage; and
  a limiter configured to limit an amplitude of the input voltage based on the peak value held by the peak hold circuit.

15. The circuit of claim 2, further comprising a peak hold circuit configured to hold a peak value of the input voltage; and
  a limiter configured to limit an amplitude of the input voltage based on the peak value held by the peak hold circuit.

16. The circuit of claim 3, further comprising a peak hold circuit configured to hold a peak value of the input voltage; and
  a limiter configured to limit an amplitude of the input voltage based on the peak value held by the peak hold circuit.

17. A demodulation circuit comprising:
  a frequency modulation (FM) demodulator configured to generate a frequency shift keying (FSK) demodulated signal by applying frequency-voltage conversion to a FSK signal;
  a first low pass filter (LPF) configured to generate an input voltage by limiting a frequency band of an output of the FM demodulator;
  a comparator configured to compare an input voltage with a reference voltage and output a signal in accordance with a differential voltage between the input voltage and the reference voltage;
  a first charging-discharging circuit configured to generate a first voltage by multiplying the differential voltage by a first charge-discharge factor;
  a second charging-discharging circuit configured to generate a second voltage by multiplying a difference between the differential voltage and a threshold voltage by a second charge-discharge factor greater than the first charge-discharge factor; and
  a control circuit configured to compare the differential voltage with the threshold voltage, and switch between turn-on and turn-off of the second charging-discharging circuit based on a difference between the differential voltage and the threshold voltage,
  wherein a sum of the reference voltage of a preceding clock and the first voltage of the preceding clock is supplied to the comparator when the second charging-discharging circuit is turned off, a sum of the reference voltage of the preceding clock, the first voltage of the preceding clock, and the second voltage of the preceding clock is supplied to the comparator when the second charging-discharging circuit is turned on.

18. The circuit of claim 17, further comprising a peak hold circuit configured to hold a peak value of the input voltage; and
  a limiter configured to limit an amplitude of the input voltage based on the peak value held by the peak hold circuit.

19. The circuit of claim 17, further comprising a second LPF is configured to reduce a noise component of the input voltage to be supplied to the comparator and operate at the same clock speed as the clock speed of the comparator, the first charging-discharging circuit, and the second charging-discharging circuit.

20. Tuner for a vehicle, the tuner comprising:
  a comparator configured to compare an input voltage corresponding to a radio frequency signal sent from a remote key with a reference voltage and output a signal in accordance with a differential voltage between the input voltage and the reference voltage;
  a first charging-discharging circuit configured to generate a first voltage by multiplying the differential voltage by a first charge-discharge factor;
  a second charging-discharging circuit configured to generate a second voltage by multiplying a difference between the differential voltage and a threshold voltage by a second charge-discharge factor greater than the first charge-discharge factor;
  a control circuit configured to compare the differential voltage with the threshold voltage, and switch between turn-on and turn-off of the second charging-discharging circuit based on a difference between the differential voltage and the threshold voltage; and a door lock controller configured to control lock and unlock of a door of the vehicle based on the signal outputted from the comparator, wherein a sum of the reference voltage of a preceding clock and the first voltage of the preceding clock is supplied to the comparator when the second charging-discharging circuit is turned off, a sum of the reference voltage of the preceding clock, the first voltage of the preceding clock, and the second voltage of the preceding clock is supplied to the comparator when the second charging-discharging circuit is turned on.

* * * * *